United States Patent [19]

Iacovangelo

[11] Patent Number: 4,985,076

[45] Date of Patent: Jan. 15, 1991

[54] AUTOCATALYTIC ELECTROLESS GOLD PLATING COMPOSITION

[75] Inventor: Charles D. Iacovangelo, Schenectady, N.Y.

[73] Assignee: General Electric Company, Schenectady, N.Y.

[21] Appl. No.: 431,358

[22] Filed: Nov. 3, 1989

[51] Int. Cl.$^5$ ................................................. C09D 1/00
[52] U.S. Cl. .................................. 106/1.26; 106/1.25; 427/304
[58] Field of Search ......................... 106/1.26; 427/304

[56] References Cited

U.S. PATENT DOCUMENTS 4,792,469 12/1988 Saito et al. .......................... 106/1.26

FOREIGN PATENT DOCUMENTS 16409 10/1962 Japan ................................... 106/1.26

OTHER PUBLICATIONS

Matsuoka et al., Heavy Deposition of Electroless Gold, Plating and Surface Finishing, May 1988, pp. 102–106.
Ganu and Mahapatra, Electroless Gold Deposition for Electronic Industry, Journal of Scientific & Industrial Research, vol. 46, 4–1987, pp. 154–161.
Ali & Christie, A Review of Electroless Gold Deposition Processes, Gold Bull., 1984, 17(4), pp. 118–127.
Okinaka et al., Some Practical Aspects of Electroless Gold Plating, Journal of Electrochemi. Soc., 1–1974, pp. 56–62.
Pourbaix, M., Atlas of Electrochemical Equilibria in Aqueous Solutions, First English Ed., 1966, Pergamon Press, Section 5.2, pp. 168–176.
Hawley, G., The Condensed Chemical Dictionary, 8th Edition, 1971, Van Norstrand Company, pp. 229, 476, 477, 732, 738.
Lange's Handbook of Chemistry, 9th Edition, 1956, Handbook Publishers, Inc., pp. 250–251.

*Primary Examiner*—William R. Dixon, Jr.
*Assistant Examiner*—Susan Hollenbeck
*Attorney, Agent, or Firm*—Sudhir G. Deshmukh; James C. Davis, Jr.; William H. Pittman

[57] ABSTRACT

An aqueous autocatalytic electroless gold plating composition having improved stability, a high plating rate, and excellent throwing power is provided which comprises about 0.002 to about 0.05 moles per liter (M) of a water-soluble alkali metal monovalent gold cyanide complex, about 0.01 to about 0.1M of a water-soluble cyanide compound, about 0.1 to about 1.0M of a carbonate compound, about 0.1 to about 0.45M of an aliphatic amine, and about 0.01 to about 0.1M of a reducing agent selected from the group consisting of water soluble alkali metal borohydrides and water soluble amine boranes, the plating composition to having a pH in the range of about 10–14.

17 Claims, No Drawings

AUTOCATALYTIC ELECTROLESS GOLD PLATING COMPOSITION

BACKGROUND OF THE INVENTION

The present invention relates to electroless gold plating compositions. More particularly, the present invention is directed to autocatalytic gold plating compositions used for plating gold onto gold.

Electroless plating is useful in applications requiring coatings for complex shapes. This capacity makes electroless plating techniques particularly useful in the electronics industry, for example, in the metallization of conductors and insulators in printed circuit boards. Base metals such as nickel and copper are often used in electroless plating processes to metallize conductors and insulators. However, because of its low contact resistance and beneficial effects on bonding leads, electroless gold plating is continually desired for coating complex shapes and electrically isolated tracks and bonding pads in printed circuit boards. It has been found, however, that electroless gold plating baths are not as easy to operate as the electroless base metal plating baths, for example, with respect to bath stability and plating rate.

The term "autocatalytic" is used herein to describe a plating system which is capable of depositing gold on a gold substrate. Autocatalytic gold plating is advantageous, for example, for increasing the thickness of existing gold surfaces which are too thin for some uses. Autocatalytic electroless gold plating compositions are known in the art. Reference may be made, for example, to U.S. Pat. Nos. 3,700,469; 3,917,885; and 4,337,091.

U.S. Pat. No. 3,700,469 to Okinaka discloses an autocatalytic electroless gold plating bath containing a soluble gold cyanide complex ion, excess free cyanide to stabilize the gold cyanide complex ion, an alkaline agent as a pH adjustor, and an alkali metal borohydride or dimethylamine borane as a reducing agent. Although a truly autocatalytic plating bath, the Okinaka bath has several limitations including instability, low plating rate (about 1 micron per hour), difficulty of bath replenishment, and sensitivity to nickel ions in solution.

U.S. Pat. No. 3,917,885 to Baker discloses an autocatalytic electroless plating bath purportedly having improved stability by adding an alkali metal imide complex of the metal to be plated, e.g., gold. However, the Baker bath has been found to have the same problems as the Okinaka bath, especially sensitivity to nickel contamination and deteriorating plating rate.

U.S. Pat. No. 4,337,091 to El-Shazly et al. discloses the use of trivalent gold metal complexes as the source of gold in an electroless gold plating bath, the reducing agent being any of the borohydrides, cyanoborohydrides or amine boranes that are soluble and stable in aqueous solution. A later version of the El-Shazly bath, disclosed in U.K. Patent Application G.B. 2121444A uses a mixture of trivalent and monovalent water-soluble gold cyanide complexes. The El-Shazly baths suffer from the same limitations as the prior art baths described above.

In autocatalytic plating, oxidation/reduction reactions begin simultaneously when the substrate is immersed in the plating bath. These reactions occur at the surface of the metal or metallized substrate. At the substrate, the gold ions accept electrons from the reducing agent and deposit a gold film on the substrate. Initially, the reducing agent reacts on the substrate, giving electrons to the metal ions and being converted to its oxidized form. The gold film then catalyzes the reaction and causes it to continue autocatalytically.

In an electroless bath containing an alkali metal gold cyanide complex, an alkali metal cyanide as a complexing agent, an alkali metal hydroxide, and dimethylamine borane as a reducing agent, cyanide is a strong poison for the oxidation of the reducing agent. However, cyanide is necessary to prevent the spontaneous decomposition of the bath by reaction [1] below:

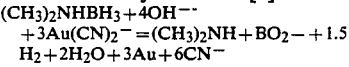

$$(CH_3)_2NHBH_3 + 4OH^- + 3Au(CN)_2^- = (CH_3)_2NH + BO_2^- + 1.5 H_2 + 2H_2O + 3Au + 6CN^-$$

The oxidation kinetics and plating rate of the bath may be increased by decreasing cyanide or increasing the reducing agent and the alkali metal hydroxide. In doing so, however, the bath becomes more prone to spontaneous decomposition by reaction [1]. Another way in which the oxidation kinetics and plating rate may be increased is by adding a substance to the bath which would promote oxidation of the reducing agent without entering into reaction [1]. The present invention is based on the discovery that a combination of carbonate and an aliphatic amine acts as such a promoter.

In an electroless bath containing an alkali metal hydroxide, alkali metal carbonate will be continuously formed in the bath due to reaction of the hydroxide with carbon dioxide in the air. It has been found, however, that the addition of carbonate initially to a plating bath also comprising a water soluble alkali metal monovalent gold cyanide complex, a water-soluble alkali metal cyanide compound as complexing agent and an alkaline agent results in an autocatalytic electroless plating bath having improved stability and a higher plating rate as compared to a bath to which carbonate was not initially added.

The use of carbonate as an activator for an alkali metal borohydride is described in U.S. Pat. No. 4,092,154 to Dietz, Jr. et al. The Dietz patent discloses a precipitating agent for recovering precious metals such as gold from aqueous cyanide solutions, wherein the precipitating agent contains aluminum powder and a reducing agent which can be an alkali metal borohydride. The precipitating agent can also contain an alkali metal carbonate as an activator for the reducing agent. According to column 3, lines 59 et seq, of the patent, the addition of the alkali metal carbonate to the precipitating agent increased the speed and completeness of the precipitation reaction.

Unlike the situation in Dietz, Jr. et al., the precipitation of gold from the plating solution in the present invention is undesirable and is avoided despite the action of the carbonate as an activator for the reducing agent. Instead, in the present invention, carbonate in combination with the other components of the bath provide a plating bath having excellent stability against precipitation of the gold from solution and improved rate in plating the gold onto a gold substrate immersed in the solution.

The use of carbonate in electroless plating baths is known in the art. Reference may be made, for example, to U.S. Pat. Nos. 3,515,571 and 4,091,128, to Levy and Franz, respectively. These references describe non-autocatalytic electroless gold plating baths containing gold salt, a complexing agent for the gold salt, and hydrazine as the reducing agent. In both references, carbonate is used as the complexing agent for gold. Neither reference discloses the presence of cyanide in the baths. In the plating bath of the present invention, cyanide is present as the complexing agent for gold, thereby allowing the carbonate to be free to accelerate the oxidation of the reducing agent. Carbonate will not function as an activator in the present invention if it is complexed with the gold.

The use of carbonate as an activator for oxidation of a reducing agent in an autocatalytic electroless plating bath is disclosed in application Ser. No. 07/431,360, filed on Nov. 3, 1989 C.D. Iacovangelo, assigned to the assignee of the present invention. Although the use of carbonate alone as the promoter in such a bath provides excellent plating rates, there is room for improvement in the uniformity of the initial deposition.

The use of an aliphatic amine in an autocatalytic electroless plating bath is disclosed in European Patent Application No. 25041 to Saito et al, which describes an akaline electroless gold plating solution containing a gold salt, a boron-based reducing, agent, and an amine compound. The amine is used in the Saito bath to achieve a high plating rate and good "throwing power", which denotes therein that all the surface of the substrate to be plated is uniformly covered with a gold plated film. It is stated in Saito et al the plating rates as high as 3 micrometers per hour were achieved as a result of the presence of the aliphatic amine.

The present invention is based on the discovery hat the presence of carbonate and an aliphatic amine in an autocatalytic electroless gold plating bath containing a boron-based reducing agent provides plating rates up to 10 micrometers per hour as well as uniform gold coverage on the substrate. Thus, much better throwing power is achieved with the use of carbonate and amine than with carbonate alone, and substantially higher plating rates are obtained using amine and carbonate than with amine alone.

SUMMARY OF THE INVENTION

The present invention provides an aqueous autocatalytic electroless gold plating composition comprising about 0.002 to about 0.05 moles per liter (M) of a water-soluble alkali metal monovalent gold cyanide complex, about 0.01 to about 0.1M of a water-soluble cyanide compound, about 0.1 to about 1.0M of a carbonate compound, about about 0.1 to about 0.45M of an aliphatic amine, and about 0.01 to about 0.1M of a reducing agent selected from the group consisting of water soluble alkali metal borohydrides and water soluble amine boranes, the plating composition having a pH within the range of about 10–14.

The plating bath of this invention is stable in operation, allows gold to be electrolessly plated onto gold at an excellent rate, i.e., up to about 10 micrometers per hour, with no deterioration in plating rate for a relatively long period of time, and provides uniform deposition of gold onto the substrate.

DETAILED DESCRIPTION OF THE INVENTION

The key to the present invention is the addition of a carbonate compound and an amine which accelerate the oxidation kinetics of the reducing agent on the substrate and material being plated, i.e., gold without reducing the amount of complexing agent or other poisons present to maintain bath stability.

The carbonate is typically added to the plating bath in the form of an alkali metal carbonate such as, for example, sodium or potassium carbonate, with potassium carbonate being preferred. The carbonate compound is generally added to the bath in an amount ranging from about 0..01 to about 1.0, preferably about 0.6 to about 0.8, and most preferably about 0.75 to about 0.80, M.

Aliphatic amines which may be used herein include monoalkanol amines, dialkanol amines, trialkanol amines, ethylene diamine, ethylene triamine, m-hexylamine, tetramethylene diamine, pentamethylene diamine, hexamethylene diamine, heptamethylene diamine and the like. The trialkanol amines are preferred, with triethanol being most preferred. The amine is typically used in an amount of about 0.1 to about 0.45, preferably about 0.1 to about 0.3, and most preferably about 0.1 to about 0.2M.

The gold is contained in the plating bath of this invention in the form of the complex ion $Au(CN)_2-$. It is introduced in the bath as a water-soluble alkali metal gold cyanide complex, such as, for example, potassium gold cyanide, sodium gold cyanide or lithium gold cyanide, preferably as potassium gold cyanide. The concentration of the gold cyanide complex ranges from a minimum concentration which yields reasonable plating rates to a concentration above which no improvement in bath characteristics is obtained. Typically, this concentration is in the range of about 0.002 to about 0.05, preferably about 0.005 to about 0.0075, most preferably about 0.005 to about 0.006, M.

It is essential that the electroless plating bath of this invention contain free cyanide ions in order to stabilize the gold cyanide complex. Free cyanide increases the stability of the bath and prevents spontaneous liberation of metallic gold in the presence of the reducing agent. The free cyanide is added to the bath as a water soluble cyanide compound. Suitable water soluble cyanide compounds for use in this invention include the alkali metal cyanides, such as sodium, potassium and lithium cyanide. Among these, sodium and potassium cyanide are preferred, with potassium cyanide being most preferred.

The amount of cyanide compound to be added to the bath is critical. Too low a concentration results in spontaneous reduction of the gold ions, while too high a concentration results in the rapid deterioration of the plating rate. In general, the cyanide compound should be added in an amount ranging from about 0.01 to about 0.1, preferably about 0.01 to about 0.04, and most preferably about 0.025 to about 0.035 M.

A reducing agent is used in the bath of this invention to supply electrons to the oxidation-reduction reaction. Suitable reducing agents include any of the borohydrides or amine boranes which are soluble and stable in aqueous solution. Thus, alkali metal borohydrides, preferably sodium and potassium borohydrides, may be used, although various substituted borohydrides, such as sodium or potassium trimethoxyborohydride may also be used. The preferred reducing agents for use in the present invention are the amine boranes such as mono- and di- lower alkyl, e.g., up to $C_6$ alkyl-amine boranes, preferably isopropyl amine borane and dimethylamine borane. For purposes of the present invention, dimethylamine borane is preferred.

The reducing agent is added to the bath in an amount ranging from about 0.01 to about 0.1, preferably about 0.04 to about 0.08, and most preferably about 0.045 to about 0.055, M.

The plating composition of this invention should be maintained at a pH within the range of 10 to about 14, and preferably within the range of about 12 to about 14, in order to obtain the desired results. It is therefore preferred that an alkali metal hydroxide, such as sodium or potassium hydroxide, and preferably potassium hydroxide be used to maintain the pH at this level.

The amount of alkali metal hydroxide added to the bath is generally about 0.25 to about 1.0, preferably about 0.78 to about 0.82, and most preferably about 0.80, M.

It is to be understood that the particular amount at which any of the ingredients should be added to the bath of this invention will depend on the amounts added of the other ingredients. Reaction (1) and the formula below for the constant "K" for Reaction (1) are used as guidelines for making selections of useful variants of the composition of the present invention.

$$K = \frac{[(CH_3)_2NH] \, [BO_2^-] \, [CN^-]^6}{[(CH_3)_2NHBH_3] \, [OH^-]^4 \, [Au(CN)^-]^3}$$

The criterion applied is that a change selected to be made in the concentration of one species must be compensated for in the other species such as to keep the value of K constant.

In addition, other substances such as, for example, lead, thiourea, arsenic, and the like, may be added to the plating bath in order to improve its properties. For example, lead is commonly added to electroless plating baths in the form of a salt to prevent the formation of metal particulates or "seeds" which continue to grow until the entire solution is depleted of the metal ions. Without the lead, any small particles which enter the bath, e.g., dust, will nucleate seeds. As can be seen in Table II & Table III, lead, like cyanide, acts as a poison for the oxidation of the reducing agent. However, also like cyanide, lead stabilizes the bath against spontaneous decomposition.

Examples of suitable lead salts for use herein include lead acetate, lead citrate, lead maleate, lead phosphate, lead tartrate, lead sulfate, and mixtures thereof. Lead acetate is preferred. The lead is generally added in an amount ranging from about 1 to about 15 ppm, preferably about 3 to about 15 ppm, and most preferably about 5, ppm.

The following table describes a preferred gold plating bath composition (1 liter) with optimal concentrations given providing the greatest stability (i.e., with respect to bath life and operating conditions):

TABLE I

| | |
|---|---|
| Dimethylamine Borane | 0.050M |
| Potassium Gold Cyanide | 0.005M |
| Potassium Cyanide | 0.035M |
| Potassium Hydroxide | 0.800M |
| Potassium Carbonate | 0.750M |
| Triethanol Amine | 0.100M |
| Lead Acetate | 5 ppm |

The balance of the electroless plating bath of this invention is distilled water. The bath is normally used at a temperature of between about 70° C. and 100° C. Optimal operation will be at 80° C., at which temperature the rate of gold deposition is up to about 10 micrometers per hour.

To carry out the electroless gold plating on a given substrate, the substrate is immersed in the stirred plating solution for an exposure time providing the requisite gold deposit thickness. Thereafter, the substrate is removed from the bath and immediately rinsed with distilled water to remove any residual plating chemicals from the plated gold metal surfaces. Generally, the rinse water is quickly removed by blotting the substrate dry or by immersion of the substrate in sequence in a series of solvents. In carrying out the gold plating of substrates on a continuing basis all components of the formulation selected should be added to the plating bath at regular intervals or continuously to replenish the bath. Preferably, the components being added are introduced in aqueous form such that they replenish the bath to within 20% or less of its original concentration. The plating solution volume is maintained by introducing distilled water to offset water lost by evaporation.

The present invention will be further understood from the description of specific examples which follow. These examples are intended for illustrative purposes only and should not be construed as a limitation upon the broadest aspects of the invention.

The following examples illustrate the effects of various additives on the kinetics of dimethylamine borane (DMAB) oxidation.

EXAMPLES 1-9

Examples 1-9 illustrate the kinetics of the oxidation of dimethylamine borane (DMAB) on gold foil at 80° C. in plating solutions of 0.8M KOH and 0.05M DMAB. The compositions of the baths used in Examples 1-9 are shown in Table II below.

TABLE II

| Composition of Baths in Examples 1-9 | | |
|---|---|---|
| Example No. | Poisons | Promoters |
| 1 | None | None |
| 2 | 0.035M KCN | None |
| 3 | 0.035M KCN 15 ppm Pb | None |
| 4 | 0.035M KCN 15 ppm Pb | 0.25M TEA |
| 5 | 0.035M KCN 15 ppm Pb | 0.45M TEA |
| 6 | 0.035M KCN 15 ppm Pb | 0.75M TEA |
| 7 | 0.035M KCN 15 ppm Pb | 0.25M $CO_3^=$ |
| 8 | 0.035M KCN 15 ppm Pb | 0.50M $CO_3^=$ |
| 9 | 0.035M KCN 15 ppm Pb | 1.00M $CO_3^=$ |

Example 1 illustrates the oxidation kinetics of a bath containing no poisons or promoters. Example 2 illustrates the kinetics of a bath containing KCN as a poison for oxidation and no promoters. Example 3 illustrates the kinetics of a bath containing both KCN and lead as poisons and no promoters. Examples 4-6 illustrate the kinetics of baths containing KCN and lead as poisons and varying amounts of triethanol amine (TEA) as a promoter. Examples 7-9 illustrate the kinetics of a bath containing KCN and lead as poisons and varying amounts of $CO_3^=$ as a promoter.

The oxidation kinetics of the baths used in Examples 1-9 are shown in Table III below. The current density at 0.84 volts, which is the potential at which the baths plate gold on gold, is used as a measure of the rate of DMAB oxidation. Table III also includes data for the equivalent plating rate.

TABLE III

DMAB Oxidation and Plating on Gold Foil in Examples 1-9

| Example No | $i_p$[a] (mA/cm2) | Equiv. Plating Rate (micrometers/hour) |
|---|---|---|
| 1 | 50 | 185 |
| 2 | 2 | 7.4 |
| 3 | 0.5 | 1.85 |
| 4 | 0.7 | 2.6 |
| 5 | 1.3 | 4.8 |
| 6 | 0.6 | 2.2 |
| 7 | 0.9 | 3.3 |
| 8 | 1.6 | 5.9 |
| 9 | 3.3 | 12.2 |

[a] $i_p$ = current density

As shown in Table III, carbonate acts as an oxidation promoter, increasing the current from 0.5 to 0.9, 1.6, and 3.3 mA/cm2 at concentrations of 0.25, 0.50, and 1.0 M. The equivalent plating rate increased from 1.85 to 12.2 micrometers per hour. Triethanol amine also increased the current at 0.25 and 0.45M but decreased the current with further additions. These results agree with those described in Saito et al, cited previously herein, which also found the plating rate to peak at 0.45M.

COMPARATIVE EXAMPLE 10 AND EXAMPLES 11-13

Comparative Example 10 and Examples 11-13 illustrate the gold plating of a gold substrate using plating baths which are identical except for the presence of carbonate and triethanol amine.

The plating bath used in Comparative Example 10 contained 0.005M of KAu(CN)$_2$, 0.05M of DMAB, 0.8M of KOH, 0.035M of KCN, and 15 ppm of Pb(C$_2$H$_3$O$_2$)$_2$.3H$_2$O. The plating bath used in Example 11 contained the same ingredients as that of Comparative Example 10 plus 0.45M of triethanol amine (TEA). The plating bath used in Example 12 contained the same ingredients as that of Comparative Example 10 plus 1.00M of CO$_3$=. The plating bath used in Example 13 had the composition set forth in Table I above.

In these examples, a gold foil substrate was gold plated as follows. A 300 ml solution of gold plating composition was prepared and heated to 80° C. on a stirrer hot plate in a 500 ml pyrex beaker. A gold foil sample having a surface area of 4 cm$^2$ was immersed for 10 minutes in the plating bath and weighed. In the bath used in Comparative Example 10, the potential versus a Ag/AgCl reference electrode was stable throughout plating at −0.84 volts. The weight gain after 10 minutes was 1.28 milligrams, which is equivalent to 0.16 micrometers of gold or a plating rate of 1 micrometer per hour. For the plating bath used in Example 11, the plating potential was −0.85 volts and the plating rate was 2.8 micrometers per hour. For the plating bath used in Example 12, the plating potential was −0.84 volts and the plating rate was 8 micrometers per hour. For the plating bath used in Example 13, the plating potential was also −0.84 volts and the plating rate was 10 micrometers per hour.

It is clear from these results that the presence of carbonate which accelerated DMAB oxidation on gold foil caused the plating rate to increase. The addition of triethanol amine to a bath containing carbonate did not improve the plating rate and in fact reduced it but its addition did provide a more uniform initial deposit. A bath containing both carbonate and triethanol amine gave the optimum performance of high plating rate and good throwing power.

The plating bath used in Example 13 above was operated for up to thirty days at 80° C. with no appearance of gold seeds in the bath and no deterioration of plating rate. Operation of the bath at temperatures of 65°-90° C. resulted in no apparent sensitivity to seeding with temperature fluctuations. Nickel ions were added to the bath to examine sensitivity to nickel in the bath, a major limitation of other autocatalytic baths, as mentioned previously herein. No deterioration in performance was observed.

While the present invention has been described with reference to particular embodiments thereof, it will be understood that numerous modifications may be made by those skilled in the art without actually departing from the spirit and scope of the invention as defined in the appended claims.

What is claimed is:

1. An aqueous autocatalytic electroless gold plating composition comprising about 0.002 to about 0.05M of a water-soluble alkali metal monovalent gold cyanide complex, about 0.01 to about 0.1M of a water-soluble cyanide compound, about 0.1 to about 0.1M of a carbonate compound, about 0.1 to about 0.45 M of an aliphatic amine, and about 0.01 to about 0.1M of a reducing agent selected from the group consisting of water soluble alkali metal borohydrides and water soluble amine boranes, the plating composition having a pH within the range of about 10-14.

2. A gold composition according to claim wherein the composition has a pH within the range of about 12 to about 14.

3. A gold plating composition according to claim 1 further comprising an alkali metal hydroxide in an amount sufficient to maintain the pH in the specified range.

4. A gold plating composition according to claim 3 wherein the composition comprises about 0.005 to about 0.0075M of the alkali metal monovalent gold cyanide complex, about 0.01 to about 0.04M of the cyanide compound, about 0.6 to about 0.8M of the carbonate compound, about 0.1 to about 0.3M of the aliphatic amine, about 0.04 to about 0.08M of the reducing agent, and about 0.25 to about 1.0M of the alkali metal hydroxide.

5. A gold plating composition according to claim 3 wherein the composition comprises about 0.005 to about 0.006M of the alkali metal monovalent gold cyanide complex, about 0.025 to about 0.035M of the cyanide compound, about 0.75 to about 0.80M of the carbonate compound, about 0.1 to about 0.2M of the aliphatic amine, about 0.045 to about 0.055M of the reducing agent, and about 0.78 to about 0.82M of the alkali metal hydroxide.

6. A gold plating composition according to claim 1 wherein the carbonate compound is an alkali metal carbonate.

7. A gold plating composition according to claim 6 wherein the carbonate is potassium carbonate.

8. A gold plating composition according to claim 1 wherein the aliphatic amine is a monoalkanol amine, dialkanol amine, trialkanol amine, ethylene diamine, ethylene triamine, m-hexylamine, tetramethylene diamine, pentamethylene diamine, or hexamethylene diamine.

9. A gold plating composition according to claim 8 wherein the aliphatic amine is a trialkanol amine.

10. A gold plating composition according to claim 9 wherein the trialkanol amine is triethanol amine.

11. A gold plating composition according to claim 1 wherein the water-soluble alkali metal monovalent gold cyanide complex is potassium gold cyanide.

12. A gold plating composition according to claim 1 wherein the water soluble cyanide compound is an alkali metal cyanide.

13. A gold plating composition according to claim 12 wherein the alkali metal cyanide is potassium cyanide.

14. A gold plating composition according to claim 3 wherein the alkali metal hydroxide is potassium hydroxide.

15. A gold plating composition according to claim 1 further comprising about 1 to about 15 ppm of a lead salt.

16. A gold plating composition according to claim 15 wherein the lead salt is lead acetate.

17. An autocatalytic electroless aqueous gold plating composition comprising about 0.005M of potassium gold cyanide, about 0.035M of potassium cyanide, about 0.050M of dimethylamine borane, about 0.800M of potassium hydroxide, 0.750M of potassium carbonate, about 0.100M of triethanol amine, and about 5 ppm of lead acetate.

* * * * *